United States Patent [19]
Heil et al.

[11] Patent Number: 6,057,712
[45] Date of Patent: May 2, 2000

[54] INTEGRATED COMPARATOR CIRCUIT WITH FOUR MOSFETS OF DEFINED TRANSFER CHARACTERISTICS

[75] Inventors: Holger Heil; Josef-Matthias Gantioler; Rainald Sander, all of München, Germany

[73] Assignee: Siemens Aktiengesellschaft, Munich, Germany

[21] Appl. No.: 08/330,341

[22] Filed: Oct. 27, 1994

[30] Foreign Application Priority Data

Oct. 29, 1993 [DE] Germany .............................. 43 37 086

[51] Int. Cl.[7] ...................................................... H03K 5/22
[52] U.S. Cl. .................................................. 327/77; 327/63
[58] Field of Search ................................. 327/50, 51, 63, 327/65, 66, 67, 69, 77

[56] References Cited

U.S. PATENT DOCUMENTS

| | | | |
|---|---|---|---|
| 4,173,756 | 11/1979 | Kawagai et al. | 327/50 |
| 4,262,221 | 4/1981 | Dingwall | 327/63 |
| 4,328,434 | 5/1982 | Geller | 327/72 |
| 4,539,495 | 9/1985 | Demler | 327/51 |
| 4,771,194 | 9/1988 | Van Zeghbroeck | 327/51 |
| 4,800,301 | 1/1989 | Tsai | 327/65 |
| 4,808,848 | 2/1989 | Miller | 327/66 |
| 4,841,177 | 6/1989 | Sugiyama et al. | 327/567 |
| 5,296,753 | 3/1994 | Nakadai | 327/77 |
| 5,434,521 | 7/1995 | Leipold et al. | 327/78 |

FOREIGN PATENT DOCUMENTS

| | | |
|---|---|---|
| 0292270 | 11/1988 | European Pat. Off. . |
| 4138860 | 6/1993 | Germany . |

*Primary Examiner*—Kenneth B. Wells
*Attorney, Agent, or Firm*—Herbert L. Lerner; Laurence A. Greenberg; Werner H. Stemer

[57] ABSTRACT

An integrated comparator includes an inverter with a first depletion FET and a first enhancement FET, and a series circuit with a second depletion FET and a second enhancement FET. The second depletion and enhancement FETs are connected in series between a first supply voltage terminal and a first input terminal. A node between the second enhancement and depletion FETs is connected to the gate terminal of the first enhancement FET. The transfer characteristic curve of the second enhancement FET is steeper than the transfer characteristic curve of the first enhancement FET. All of the MOSFETs are of the same channel type. The voltage to be compared is connected between the second enhancement FET and ground. The switching point is determined by the transfer characteristics of the two enhancement FETs.

2 Claims, 1 Drawing Sheet

6,057,712

1

INTEGRATED COMPARATOR CIRCUIT WITH FOUR MOSFETS OF DEFINED TRANSFER CHARACTERISTICS

BACKGROUND OF THE INVENTION

Field of the Invention

The invention relates to an integrated comparator circuit having a series circuit of first and second MOSFETs connected between a first terminal for an operating voltage and a first input terminal, an inverter stage with third and fourth MOSFETs being connected between the first terminal and a second terminal for the operating voltage, a junction between the first and second MOSFETs being connected to the gate terminal of the fourth MOSFET, the transfer characteristic curve of the second MOSFET being steeper than the transfer characteristic curve of the fourth MOSFET, and the second and fourth MOSFETs each being an enhancement MOSFET.

Such a circuit configuration is the subject of German Patent DE 41 38 860 C1, corresponding to co-pending U.S. Pat. No. 5,434,521, for instance. The comparator circuit described therein has MOSFETs of both channel types, both in the inverter stage and in the series circuit. That requires the use of CMOS technology, which is more complex than NMOS or PMOS technology.

SUMMARY OF THE INVENTION

It is accordingly an object of the invention to provide an integrated comparator circuit, which overcomes the hereinafore-mentioned disadvantages of the heretofore-known devices of this general type and which can be produced by one of the aforementioned simpler technologies.

With the foregoing and other objects in view there is provided, in accordance with the invention, an integrated comparator circuit, comprising first and second terminals for an operating voltage; first and second input terminals; first, second, third and fourth MOSFETs each having drain, source and gate terminals and a transfer characteristic curve; the first and second MOSFETs being connected in a series circuit between the first terminal for the operating voltage and the first input terminal, defining a junction between the first and second MOSFETs being connected to the gate terminal of the fourth MOSFET; the third and fourth MOSFETs being connected in an inverter stage between the first and second terminals for the operating voltage; the transfer characteristic curve of the second MOSFET being steeper than the transfer characteristic curve of the fourth MOSFET; the second and fourth MOSFETs each being an enhancement MOSFET; the first and third MOSFETs each being a depletion MOSFET; and all of the MOSFETs being of the same channel type.

In accordance with another feature of the invention, the second MOSFET is connected as an MOS diode.

In accordance with a further feature of the invention, each of the MOSFETs has a substrate terminal being connected to the second terminal for the operating voltage.

In accordance with a concomitant feature of the invention, the gate and source terminals of the first depletion MOSFET are interconnected, and the gate and source terminals of the third depletion MOSFET are interconnected.

Other features which are considered as characteristic for the invention are set forth in the appended claims.

Although the invention is illustrated and described herein as embodied in an integrated comparator circuit, it is nev-

2 ertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
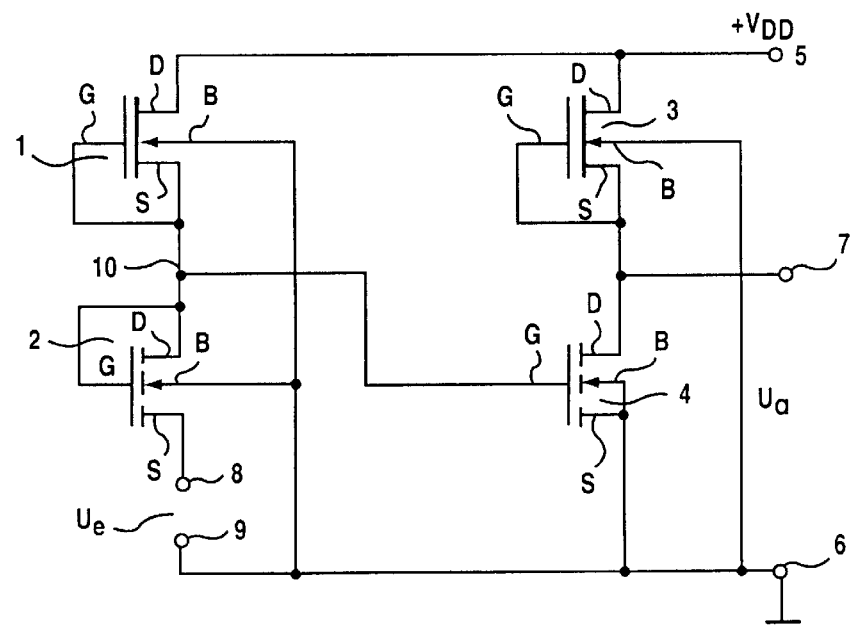
FIG. 1 is a schematic circuit diagram of a preferred exemplary embodiment of the invention.

Referring now to the figures of the drawing in detail and first, particularly, to FIG. 1 thereof, there is seen an integrated comparator which includes an inverter stage with an n-channel depletion MOSFET 3 and an n-channel enhancement MOSFET 4. A source terminal S of the MOSFET 3 is connected to a drain terminal D of the MOSFET 4. A drain terminal D of the MOSFET 3 is connected to a first terminal 5 for a supply voltage $+V_{DD}$, and a source terminal S of the MOSFET 4 is connected to a second terminal 6 for the supply voltage $+V_{DD}$. The source terminal S of the transistor 3 and the drain terminal D of the transistor 4 are connected to an output terminal 7.

The integrated comparator circuit furthermore includes a series circuit that has an n-channel depletion MOSFET 1 and an n-channel enhancement MOSFET 2. A source terminal S of the transistor 1 is connected to a drain terminal D of the transistor 2. A drain terminal D of the transistor 1 is connected to the first terminal 5, and a source terminal S of the transistor 2 is connected to a first input terminal 8. Another input terminal 9 is at the same potential as the terminal 6, for instance at ground. A junction or node point 10 between the transistors 1 and 2 is connected to a gate terminal G of the transistor 4 of the inverter stage. Gate terminals G of transistors 1 and 3 can each be connected to their respective source terminals S, or may be at fixed potential. All of the transistors have a substrate terminal B, which is connected either to the source terminal S of the respective transistor or to ground, as shown. These last alternatives differ in terms of the transfer characteristic curves of the transistors 1 and 3, as will be explained below in conjunction with FIG. 2.

In order to explain the mode of operation of the integrated comparator circuit, it is assumed that initially the voltage to be compared is $U_e=0$. In that case, the input terminal 8 is at ground, through the control stage that furnishes the voltage $U_e$. In the case of the first alternative, in which the substrate terminal B is connected to the source terminal S and the gate terminal G is connected to the source terminal S, the transistors 1 and 3 act as a current source, at a higher value $U_{DS}$. The transistors 1, 2 and 3, 4 are dimensioned in such a way that when $U_e=0$ V at the junction 10, a voltage is established that keeps the transistor 4 blocked. This causes the transistor 3 to have a low resistance, since its operating point is located in the steep portion of its $I_D/U_{DS}$ characteristic curve. A high output voltage, which is approximately equivalent to the voltage $V_{DD}$, therefore appears at the output 7. If a voltage $U_e>0$ is applied to the input terminals 8, 9, then the voltage at the junction 10 increases in accordance with the voltage divider ratio between the transistors 1 and 2.

If the cutoff voltage of the transistor 4 is exceeded, then this transistor is made conducting, and the voltage at the output 7 drops. The transistor 3 then acts as a current source and its operating point is then in the saturation range of its $I_D/U_{DS}$ characteristic curve. Therefore, the voltage drop at the output 7 signals the fact that a voltage $U_e>0$ is applied to the input terminals 8, 9. A voltage $U_a$ between the terminals 7 and 6 can be delivered to a Schmitt trigger, having an output signal level which is selected in such a way that it corresponds to logical "0" or logical "1".

In order to establish a defined response threshold of the comparator circuit, the transfer characteristic curve $I_D/U_{GS}$ of the transistor 4 is established as being flatter than that of the transistor 2. This can be achieved, for instance, by means of a different ratio between the channel length and the channel width. The transfer characteristic curves of transistors 1 and 3 may be the same, as is shown in FIG. 2, but need not be the same.

Figure 2:
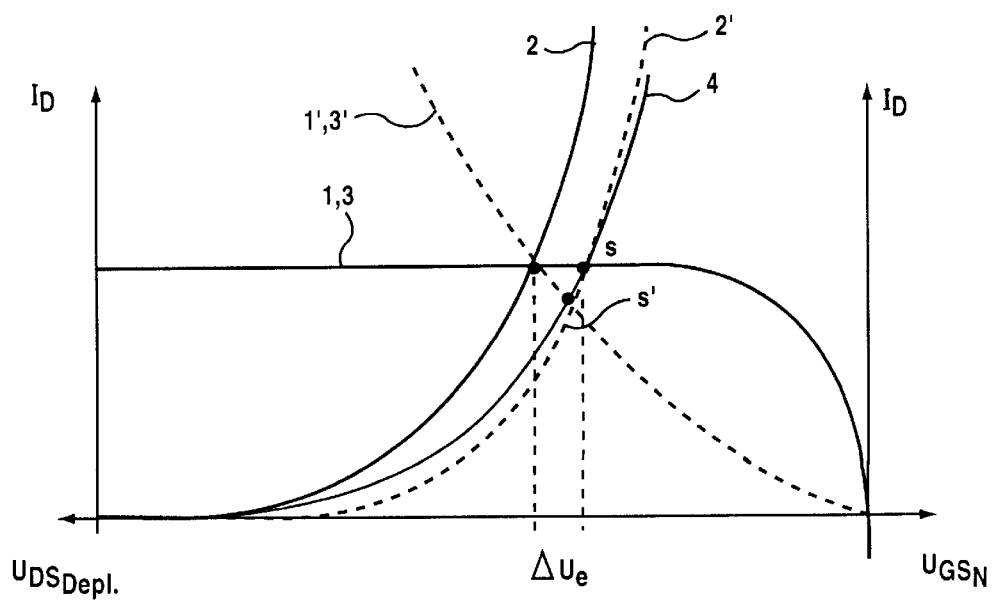
FIG. 2 is a diagram showing a mode of operation of the invention.

FIG. 2 shows the transfer characteristic curves of the four transistors. If the input voltage $U_e$ is equal to zero, then a current $I_D$, which is defined by the intersection of the transfer characteristic curves 1 and 2, is established at the junction 10. The corresponding voltage $U_{GS}$ at the transistor 4 is not sufficient to make this transistor conducting. If the voltage at the junction 10 rises because an input voltage $U_e$ is applied, then the transfer characteristic curve 2 shifts to the right in accordance with the magnitude of the input voltage $U_e$ being applied. If this shifted characteristic curve, which is indicated by reference numeral 2' and shown in dashed lines, intersects the transfer characteristic curve of the transistor 4, then the transistor 4 turns on, and the output voltage $U_a$ at the terminals 7, 6 drops. The switch point is indicated by reference numeral S.

In the second alternative, in which the substrate terminals B are connected to ground, the depletion MOSFETs 1 and 3 do not act as a current source but rather as a diode. If both transistors have the same data, then the transfer characteristic curve shown in dashed lines and indicated by reference numerals 1' and 3' results. The switch point of the comparator configuration, as in the first alternative, is the result of the intersection of the transfer characteristic curve 2', shifted by the voltage $U_e$, and the characteristic curves 1', 3'. This point is indicated by reference numeral S'.

In addition to the advantages mentioned above, the comparator circuit described above has the advantage of having its components formed exclusively by MOSFETs. Since these components are all disposed on the same single chip, changes in manufacturing parameters have the same effect on the properties of all of the transistors. Therefore, the switching threshold becomes essentially independent of production tolerances.

An especially simple embodiment is obtained if the transistor 2 is connected as a diode. In that case, its gate terminal G is connected to its drain terminal D.

We claim:

1. An integrated comparator circuit, comprising:

first and second terminals for a supply voltage;

first and second input terminals;

first, second, third and fourth MOSFETs each having drain, source and gate terminals and a transfer characteristic curve;

said first and second MOSFETs being connected in a series circuit between said first terminal for the supply voltage and said first input terminal, defining a node between said first and second MOSFETs being connected to the gate terminal of said fourth MOSFET;

said second input terminal being connected to said second terminal for the supply voltage;

said third and fourth MOSFETs being connected to form an inverter stage between said first and second terminals for the supply voltage;

the transfer characteristic curve of said second MOSFET being steeper than the transfer characteristic curve of said fourth MOSFET;

said second and fourth MOSFETs each being an enhancement MOSFET;

said first and third MOSFETs each being a depletion MOSFET; and all of said MOSFETs being of the same channel type and all of said MOSFETs having a bulk terminal connected to said second terminal for the supply voltage.

2. An integrated comparator circuit, comprising:

first and second terminals for a supply voltage;

first and second input terminals;

first, second, third and fourth MOSFETs each having drain, source and gate terminals and a transfer characteristic curve;

said first and second MOSFETs being connected in a series circuit between said first terminal for the supply voltage and said first input terminal, defining a node between said first and second MOSFETs being connected to the gate terminal of said fourth MOSFET;

said second input terminal being connected to said second terminal for the supply voltage;

said third and fourth MOSFETs being connected to form an inverter stage between said first and second terminals for the supply voltage;

the transfer characteristic curve of said second MOSFET being steeper than the transfer characteristic curve of said fourth MOSFET;

said second and fourth MOSFETs each being an enhancement MOSFET;

said first and third MOSFETs each being a depletion MOSFET;

all of said MOSFETs being of the same channel type; and wherein the gate and source terminals of said first depletion MOSFET are interconnected, and the gate and source terminals of said third depletion MOSFET are interconnected.

* * * * *